(12) United States Patent
Watanabe et al.

(10) Patent No.: US 8,969,218 B2
(45) Date of Patent: Mar. 3, 2015

(54) ETCHING METHOD, ETCHING APPARATUS AND STORAGE MEDIUM

(75) Inventors: Tsukasa Watanabe, Nirasaki (JP);
Keisuke Egashira, Nirasaki (JP);
Miyako Kaneko, Nirasaki (JP);
Takehiko Orii, Nirasaki (JP)

(73) Assignee: Tokyo Electron Limited, Minato-Ku (JP)

( * ) Notice: Subject to any disclaimer, the term of this patent is extended or adjusted under 35 U.S.C. 154(b) by 105 days.

(21) Appl. No.: 13/443,156

(22) Filed: Apr. 10, 2012

(65) Prior Publication Data

US 2012/0264308 A1 Oct. 18, 2012

(30) Foreign Application Priority Data

Apr. 14, 2011 (JP) ................................. 2011-090256

(51) Int. Cl.
*H01L 21/302* (2006.01)
*H01L 21/3105* (2006.01)
*H01L 21/311* (2006.01)
*H01L 21/67* (2006.01)
*H01L 21/02* (2006.01)

(52) U.S. Cl.
CPC ...... *H01L 21/3105* (2013.01); *H01L 21/31111* (2013.01); *H01L 21/6708* (2013.01); *H01L 21/02164* (2013.01); *H01L 21/02359* (2013.01)
USPC ............. 438/757; 438/745; 438/756; 216/97; 216/108

(58) Field of Classification Search
USPC ........ 438/775, 791, 756, 757; 216/58, 79, 80, 216/98, 99, 108; 134/1.2, 1.3
See application file for complete search history.

(56) References Cited

U.S. PATENT DOCUMENTS

| 7,985,683 | B2* | 7/2011 | Tomita et al. ................. 438/694 |
| 8,097,538 | B2* | 1/2012 | Koide et al. .................. 438/669 |
| 8,101,507 | B2* | 1/2012 | Asako et al. .................. 438/475 |
| 8,435,903 | B2* | 5/2013 | Ogawa et al. ................. 438/745 |
| 2004/0140365 | A1 | 7/2004 | Izuta |
| 2008/0308530 | A1 | 12/2008 | Izuta |
| 2012/0083127 | A1* | 4/2012 | Clark et al. ................... 438/703 |

FOREIGN PATENT DOCUMENTS

| JP | 2004-221540 A1 | 8/2004 |
| JP | 2010-147304 A1 | 7/2010 |
| JP | 2012-164949 | 8/2012 |

OTHER PUBLICATIONS

Japanese Office Action (Application No. 2011-090256) mailed Jun. 6, 2014.

* cited by examiner

*Primary Examiner* — Lan Vinh
(74) *Attorney, Agent, or Firm* — Burr & Brown, PLLC

(57) ABSTRACT

Disclosed is a technique for attaining high etching selectivity of a silicon nitride film to a silicon oxide film. The etching method includes a step of supplying a silylating agent to a substrate having a silicon nitride film and a silicon oxide film exposed on the surface thereof to thereby form a silylated film as a protective film over the surface of the silicon oxide film. After this step, an etching solution is supplied to the substrate. It is thus possible to selectively etch only the silicon nitride film.

12 Claims, 5 Drawing Sheets

SURFACE OF SiN FILM

SURFACE OF SiO$_2$ FILM

SILYLATION OF SiO$_2$ FILM

US 8,969,218 B2

ETCHING METHOD, ETCHING APPARATUS AND STORAGE MEDIUM

CROSS-REFERENCE TO RELATED APPLICATION

This application is based on and claims the benefit of priority from Japanese Patent Application No. 2011-090256 filed on Apr. 14, 2011, the entire content of which is incorporated herein by reference.

BACKGROUND OF THE INVENTION

1. Field of the Invention

The present invention relates to a technique of etching a substrate having a silicon nitride film and a silicon oxide film exposed on the surface thereof in such a manner that the silicon nitride film is selectively etched.

2. Description of the Related Art

Treatments for manufacturing semiconductor devices include wet etching treatment for etching silicon nitride film formed on the surface of a substrate such as a semiconductor wafer with an etching solution. In wet etching treatment, it is often the case that silicon nitride film is required to be selectively etched substantially without etching silicon oxide film. In order to achieve such etching, a phosphoric acid solution ($H_3PO_4$) has been conventionally used as the etching solution (refer to JP-A-2004-221540).

However, usage of phosphoric acid solution requires provision of an exclusive supply system for the phosphoric acid and consideration for preventing the clean room atmosphere from being contaminated by the phosphoric acid, and there are also disadvantages such as the high cost of phosphoric acid with high purity. Alternative etching solutions are therefore recently becoming to be used instead of phosphoric acid.

As an example of such etching solution that does not contain phosphoric acid, JP-A-2010-147304 describes an etching solution containing sulfuric acid, a fluoride compound, and water. It also describes that hydrofluoric acid and ammonium fluoride are preferably used as the fluoride compound in manufacturing of electronic devices such as semiconductors.

However, regardless of whether a substrate is etched by using a phosphoric acid etching solution or hydrofluoric acid etching solution, in either case it is actually difficult to enhance the ratio of the etching amount of the silicon nitride film to the etching amount of the silicon oxide film (hereinafter also referred to as "$SiN/SiO_2$ selectivity") to a level required to manufacture a semiconductor device.

SUMMARY OF THE INVENTION

The present invention has been devised in view of the foregoing circumstances. An object of the present invention is to provide an etching method by which the ratio of the etching amount of a silicon nitride film to the etching amount of a silicon oxide film ($SiN/SiO_2$ selectivity) can be improved to a considerably high level, and also an etching apparatus and a storage medium for carrying out the etching method.

The present invention provides, in one aspect, an etching method comprising the steps of: preparing a substrate having a silicon nitride film and a silicon oxide film exposed on the surface thereof; supplying a silylating agent to the substrate having the silicon nitride film and the silicon oxide film exposed on the surface thereof so as to form a silylated film as a protective film over the surface of the silicon oxide film on the substrate; and supplying an etching solution to the substrate so as to selectively etch the silicon nitride film.

Preferably, the etching method further comprises a step of supplying a first rinsing solution to the substrate so as to remove the silylating agent, the step being performed between the silylating agent supply step and the etching solution supply step.

Preferably, the etching method further comprises a step of supplying IPA to the substrate between the silylating agent supply step and the first rinsing solution supply step.

Preferably, the etching method further comprises a step of supplying a second rinsing solution to the substrate after the etching solution supply step.

The etching method may include a cycle of steps that is repeatedly performed for a plurality of times, the cycle comprising the steps of: supplying the silylating agent to the substrate; supplying the IPA to the substrate; supplying the first rinsing solution to the substrate; supplying the etching solution to the substrate; and supplying the second rinsing solution.

Preferably, the etching method further comprises a step of drying the substrate after supplying the second rinsing solution to the substrate.

In the etching method, IPA for drying may be supplied to the substrate in the drying step.

Preferably, the etching method further comprises a step of removing the silylated film as the protective film after supplying the second rinsing solution to the substrate.

In the etching method, the silylated film as the protective film may be removed by irradiating the substrate with UV-light.

The present invention provides, in another aspect, an etching apparatus comprising: a substrate holding unit configured to hold a substrate having a silicon nitride film and a silicon oxide film exposed on the surface thereof; a silylating agent supply mechanism configured to supply a silylating agent to the substrate held by the substrate holding unit; an etching solution supply mechanism configured to supply an etching solution to the substrate held by the substrate holding unit; and a control section that controls the silylating agent supply mechanism and the etching solution supply mechanism so as to execute steps including: supplying the silylating agent to the substrate having the silicon nitride film and the silicon oxide film exposed on the surface thereof so as to form a silylated film as a protective film over the surface of the silicon oxide film on the substrate; and supplying the etching solution to the substrate so as to selectively etch the silicon nitride film.

The etching apparatus may further comprise a rotation drive unit configured to rotate the substrate holding unit around a vertical axis; and preferably, the substrate holding unit holds the substrate horizontally, and the control section controls the rotation drive unit such that the substrate holding unit holding the substrate rotates during the silylating agent supply step and the etching solution supply step.

In the etching apparatus, preferably, the silylating agent supply mechanism comprises a silylating agent storage tank configured to store the silylating agent and a silylating agent nozzle configured to supply the silylating agent from the silylating agent storage tank to the substrate; and the etching solution supply mechanism comprises an etching solution storage tank configured to store the etching solution and an etching solution nozzle configured to supply the etching solution from the etching solution storage tank to the substrate.

The present invention provides, in another aspect, a storage medium for storing a program that can be read by a computer constituting the control section of an etching apparatus, the etching apparatus including a silylating agent supply mechanism configured to supply a silylating agent to a substrate and an etching solution supply mechanism configured to supply an etching solution to the substrate, wherein: the computer executes the program that the control section controls the etching apparatus to perform steps including: supplying the silylating agent to a substrate having a silicon nitride film and a silicon oxide film exposed on the surface thereof so as to form a silylated film as a protective film over the surface of the silicon oxide film on the substrate; and supplying the etching solution to the substrate so as to selectively etch the silicon nitride film.

According to the present invention, a silylating agent is supplied to the substrate to form a silylated film as a protective film over the surface of the silicon oxide film, and the etching solution is then supplied to the substrate. The silicon nitride film can be selectively etched by the etching solution while effectively protecting the surface of the silicon oxide film with the silylated film.

DETAILED DESCRIPTION OF THE INVENTION

A preferred embodiment of the present invention will be described below.

Figure 1:
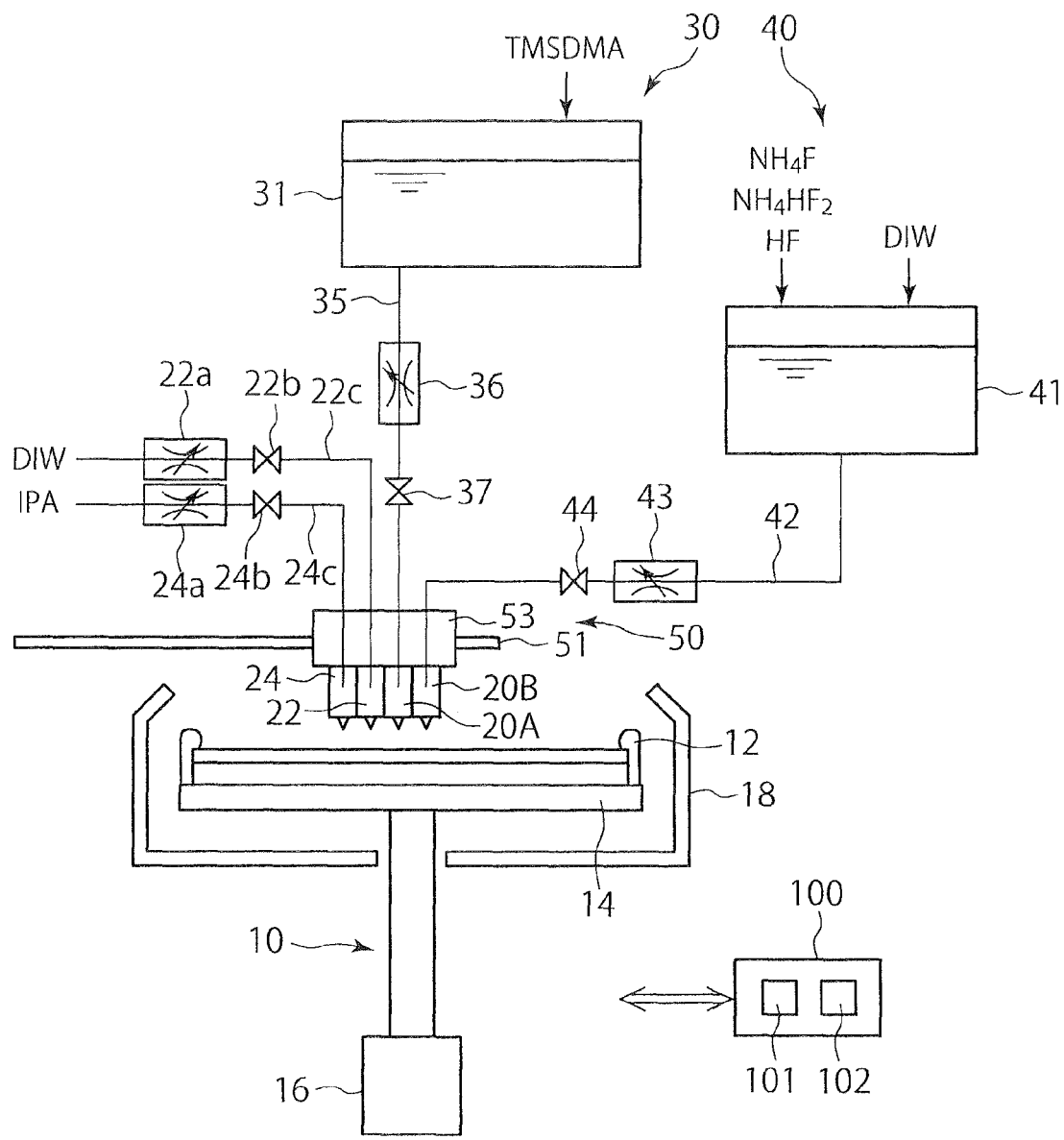
FIG. 1 is a schematic view showing the configuration of an embodiment of an etching apparatus according to the present invention.
Figure 2:
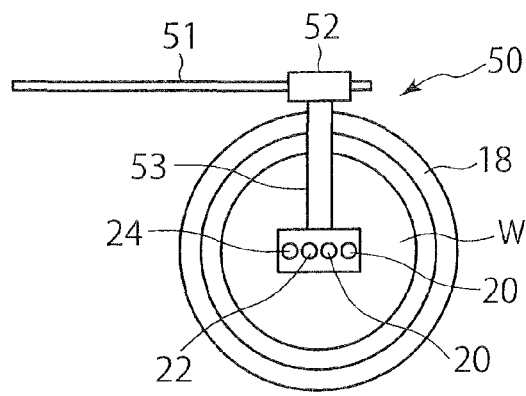
FIG. 2 is a schematic plan view of the etching apparatus shown in FIG. 1.

First, the configuration of a wet etching apparatus is to be described. As shown in FIG. 1, the wet etching apparatus includes a spin chuck 10 for rotating a substrate (a semiconductor wafer W in this embodiment) while holding the wafer substantially horizontally. The spin chuck 10 has a substrate holding unit 14 for holding the substrate horizontally with a plurality of holding members 12 that holds the edge of the substrate, and a rotation drive unit 16 for rotationally driving the substrate holding unit 14.

A cup 18 is provided to surround the substrate holding unit 14 to receive treatment solution scattered from the wafer W. The substrate holding unit 14 and the cup 18 are configured to be vertically movable relative to each other so that the wafer W can be transferred between a substrate conveying arm not illustrated and the substrate holding unit 14.

The wet etching apparatus further includes a silylating agent (silylation agent) supply mechanism 30 for supplying a silylating agent to the wafer W, and an etching solution supply mechanism 40 for supplying an etching solution to the wafer W.

In this embodiment, TMSDMA (trimethylsilyl dimethylamine) is used as the silylating agent supplied to the wafer W. DMSDMA (dimethylsilyl dimethylamine), TMDS (tetramethyl disilazane), bis(dimethylamino)dimethylsilane, TMSOTf (trimethylsilyl trifluoromethane sulfonate), and HMDS (hexemethyl disilazane) may also be used as the silylating agent (silylation agent). Solutions obtained by diluting these silylating agents with a diluting solvent such as cyclohexane and propylene glycol monomethyl ether acetate (PEGMEA) may also be employed.

The silylating agent may be at a room temperature (for example, 24° C.). However, the strength of the protective film formed over the oxide film can be further enhanced by using a silylating agent heated to a temperature not lower than 30° C. and lower than the boiling point of the silylating agent (e.g., the boiling point of TMSDMA is 84° C.): preferably, 40 to 60° C.

Instead of heating the silylating agent, the wafer W may be heated, for example, to 30° C. or higher by using a mechanism for heating the wafer W on the substrate holding unit 14. The heating mechanism may be a heater (not illustrated) provided to the substrate holding unit 14, or a UV lamp or a LED lamp disposed on the side opposing the substrate holding unit 14.

As the etching solution, an aqueous solution containing at least one of HF, NH$_4$F, and NH$_4$HF$_2$ diluted with water (DIW (pure water) in this embodiment) may be used. Phosphoric acid solutions (H$_3$PO$_4$), and aqueous solutions containing HF and H$_2$SO$_4$ diluted with DIW and heated to a high temperature, for example, 150° C. or higher may as well be used as the etching solution.

Next, the silylating agent supply mechanism 30 is described. The silylating agent supply mechanism 30 has a silylating agent storage tank 31 for storing a silylating agent comprising TMSDMA, etc. and a silylating agent nozzle 20A for supplying the silylating agent to the wafer W. The silylating agent storage tank 31 is connected to the silylating agent nozzle 20A via a line 35. The line 35 is provided with an appropriate flow regulator, for example, a flow regulating valve 36 and an on-off valve 37.

The etching solution supply mechanism 40 is next described. The etching solution supply mechanism 40 has an etching solution storage tank 41 for storing an etching solution and an etching solution nozzle 20B for supplying the etching solution to the wafer W.

In this embodiment, an aqueous solution containing at least one of HF, NH$_4$F, and NH$_4$HF$_2$ diluted with water (H$_2$O) (DIW (pure water) in this embodiment) is stored in the etching solution storage tank 41. Specific examples of an HF-based chemical solution stored in the HF-based chemical solution tank 41 are: (a) a solution obtained by diluting an aqueous solution comprising 30.8 wt % NH$_4$HF$_2$ and 8.9 wt % HF (corresponds to LAL5000 supplied by Stella Chemifa Co.) 250 to 500 times with water (pure water); (b) a solution obtained by diluting an aqueous solution containing 7.1 wt % NH$_4$HF$_2$ and 15.4 wt % NH$_4$F (corresponds to LAL500 supplied from Stella Chemifa Co.)50 to 200 times with water (pure water). Usable etching solutions are not limited to the above and other etching solutions can also be used.

The etching solution storage tank 41 is connected to the etching solution nozzle 20B via a line 42. The line 42 is provided with an appropriate flow regulator, for example, a flow regulating valve 43 and an on-off valve 44.

The silylating agent nozzle 20A and the etching solution nozzle 20B are driven by a nozzle moving mechanism 50. The nozzle moving mechanism 50 has a guide rail 51, a moving body 52 movable along the guide rail 51 incorporating a driving mechanism, and a nozzle arm 53 whose base end is attached to the moving body 52 and leading end holds the liquid chemical nozzles 20. The nozzle moving mechanism 50 can move the silylating agent nozzle 20A and the etching solution nozzle 20B between a position right above the center of the wafer W held by the substrate holding unit 14 and a position right above the edge of the wafer W. In addition, the nozzle moving mechanism 50 can move the silylating nozzle 20A and the etching solution nozzle 20B to a stand-by position outside the cup 18 in a plan view.

The wet etching apparatus further includes a rinsing nozzle 22 for supplying pure water (DIW) to the wafer W for rinsing treatment, and an IPA nozzle 24 for supplying isopropyl alcohol (IPA) to the wafer W for drying treatment. DIW is supplied from the DIW supply source to the rinse nozzle 22 by way of a DIW line 22c having an appropriate flow regulator, for example, a flow regulating valve 22a and an on-off valve 22b. IPA is supplied from the IPA supply source to the IPA nozzle 24 by way of an IPA line 24c having an appropriate flow regulator, for example, a flow regulating valve 24a and an on-off valve 24b.

The rinsing nozzle 22 and the IPA nozzle 24 are also attached to the nozzle arm 53. The rinsing nozzle 22 and the IPA nozzle 24 can thus also be moved between the position right above the center of the wafer W held by the substrate holding unit 14 and the position right above the edge of the wafer W. The nozzles 22 and 24 can as well be moved to a stand-by position outside the cup 18.

The wet etching apparatus has a control section 100 for collectively controlling the whole operation. The control section 100 controls operation of all functional parts of the wet etching apparatus (e.g., the rotation drive unit 16, the valve 36 of the silylating agent supply mechanism 30, the valve 44 of the etching solution supply mechanism 40, the valve 22b for DIW, the valve 24b for IPA, the nozzle moving mechanism 50, etc.).

The control section 100 can be constituted by, for example, a general-purpose computer as hardware and a program as software for operating the computer (apparatus control program, treatment recipe, etc.). The software may be stored in a storage medium disposed fixedly to the computer such as a hard disk drive, or in a storage medium detachably set to the computer such as a CDROM, DVD, and flash memory. The storage medium is indicated by reference numeral 101. A processor 102 reads out a predetermined treatment recipe from the storage medium 101 and operates to execute the recipe based on the instruction from a user interface not-illustrated, etc. The functional parts of the wet etching apparatus then operates under control of the control section 100 to perform the predetermined treatment.

The illustrated substrate holding unit 14 of the spin chuck 10 is a so-called mechanical chuck type which grips the edge of the wafer W with the movable holding members 12. A so-called vacuum chuck type which vacuum-attracts the central portion of the back side of the wafer may instead be employed.

Further, while the illustrated nozzle moving mechanism 50 is a so-called linear motion type which moves the nozzles translationally, it may be a so-called swing arm type which holds the nozzles at the leading end of an arm that can rotate around the vertical axis. The four nozzles 20A, 20B, 22, and 24 are held by the same arm in the illustrated embodiment: they may instead be held by individual arms to move independently.

Next, a series of steps comprising the liquid solution treatment method performed by using the above-described wet etching apparatus, which includes etching treatment, will be described referring to FIG. 5. The series of steps described below are executed by controlling each of the functional parts of the wet etching apparatus by the control section 100 so as to attain the various process parameters defined in the process recipe stored in the storage medium 101.

Figure 3:
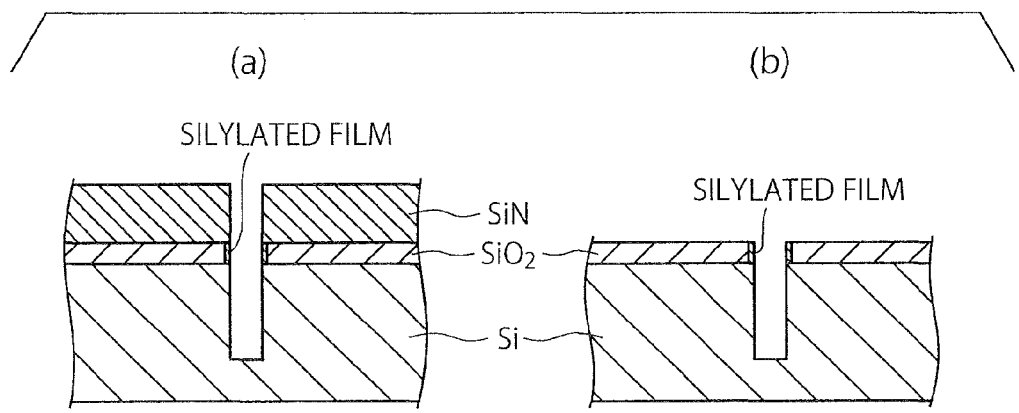
FIGS. 3(a) and 3(b) are schematic cross sectional views showing an example of the structures of a substrate for which the etching according to the present invention is intended.
Figure 4:
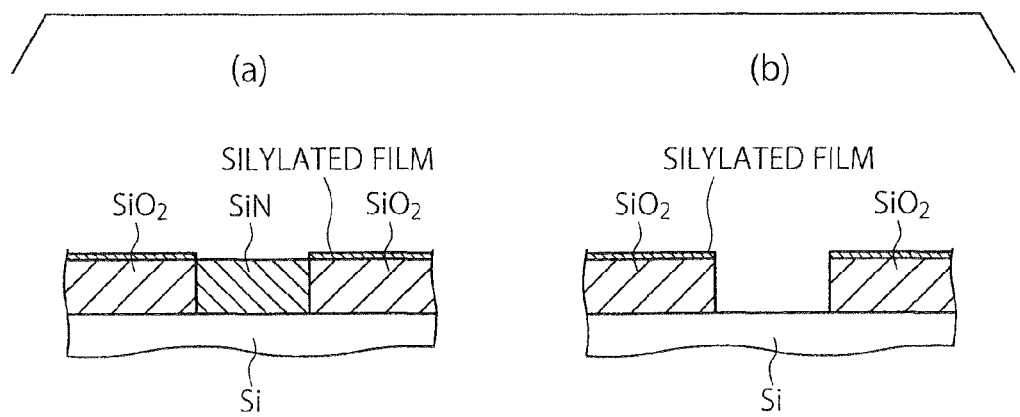
FIGS. 4(a) and 4(b) are schematic cross sectional views showing another example of the structures of a substrate for which the etching according to the present invention is intended.

The wafer W to be subjected to the treatment is a wafer that has an SiN film (silicon nitride film) and an $SiO_2$ film (silicon oxide film) exposed on its surface ("surface" here includes the inner surface of a hole or a recess formed in the wafer), and is required to have the SiN film selectively removed. FIG. 3(a) schematically shows an example of a cross sectional structure which the wafer W to be subjected to the treatment may have. An $SiO_2$ film, which is a thermal oxide film, and an SiN film are stacked over a silicon substrate (Si) with a trench through them. FIG. 3(b) shows the state of the substrate where the SiN film had been selectively etched from the state shown in FIG. 3(a). FIG. 4(a) and FIG. 4(b) schematically show another example of a cross sectional structure of the wafer W for which the treatment is intended. As in this example, both the $SiO_2$ film and the SiN film on the silicon substrate (Si) may be exposed.

First, the wafer W having a cross sectional structure as above is delivered by the conveying arm (not illustrated) into the wet etching apparatus and is held by the substrate holding unit 14 of the spin chuck 10.

[Silylating Agent Supply]

Then, the silylating agent nozzle 20A is moved to the position right above the center of the wafer W by the nozzle moving mechanism 50. Further, the rotation drive unit 16 rotates the wafer W at a predetermined number of rotation, for example, 100 rpm. In this state, the flow regulating valve 36 of the silylating agent supply mechanism 30 is adjusted to a predetermined opening degree and the on-off valve 37 opens. The silylating agent (silylation agent), for example, TMS-DMA is supplied from the silylating agent nozzle 20A at a predetermined flow rate, for example, 0.5 to 2.0 l/min to the central portion of the wafer W. The supplied TMSDMA diffuses to the edge of the wafer by the centrifugal force.

Figure 5:
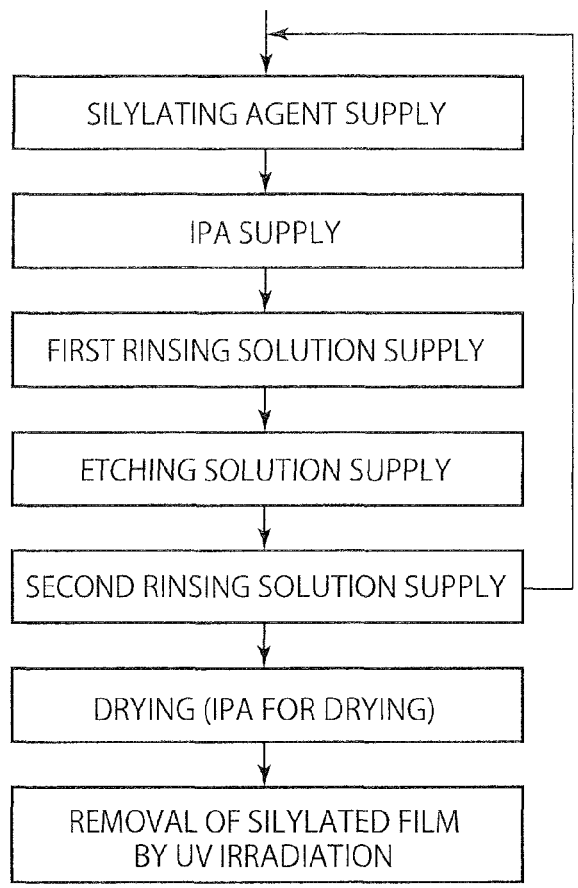
FIG. 5 is a flow chart of an etching method according to the present invention.

The silylating agent is thus supplied to the wafer W (FIG. 5). In this step, of the silicon nitride film and silicon oxide film exposed on the surface of the wafer W, the surface of the silicon oxide film is covered with a protective film of a silylated film formed thereover by the silylating agent (refer to FIG. 3(a) and FIG. 4(a)).

Figure 9:
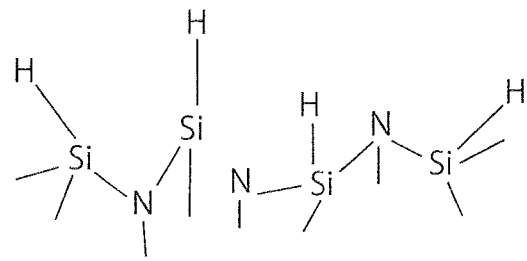
FIG. 9 is a view showing the behavior of the surface of the silicon nitride film and the behavior of the surface of the silicon oxide film when a silylating agent is supplied thereto.
Figure 9:
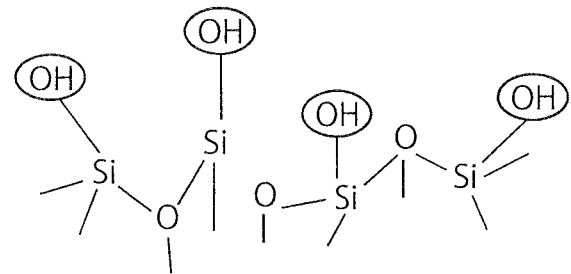
Figure 9:
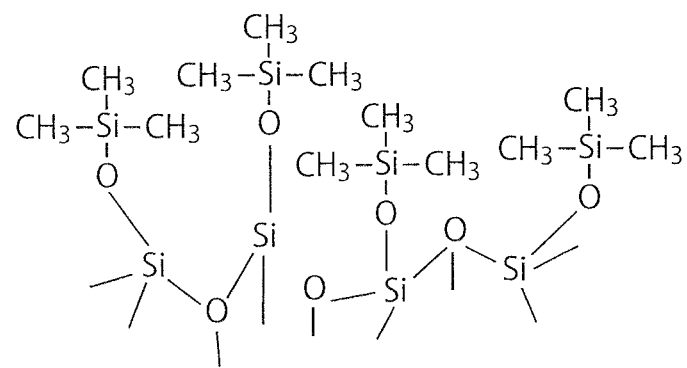

FIG. 9 shows the behavior of the surface of the silicon nitride film and the surface of the silicon oxide film when the silylating agent is supplied to the wafer W.

As shown in FIG. 9, the silicon nitride film is terminated with H groups at the surface, and the silyl groups do not bond with the H groups. On the other hand, the silicon oxide film is terminated with OH groups at the surface, and the silyl groups bond with the OH groups to form the silylated film over the surface of the silicon oxide film.

The silylated film thus formed over the surface of the silicon oxide film functions as a protective film against the etching solution as described later, resulting in the etching amount of the silicon oxide film to be suppressed.

[IPA Supply]

After finishing the silylating agent supply step, supply of the silylating agent from the silylating agent nozzle 20A is stopped, and IPA is supplied to the center of the wafer W from the IPA nozzle 24 while keeping the wafer W rotated. The silylating agent remaining on the wafer W is thus replaced with the IPA.

[First Rinsing Solution Supply]

Supply of the IPA from the IPA nozzle 24 is stopped and DIW (first rinsing solution) is supplied from the DIW nozzle 22 to the center of the wafer W while keeping the rotation of the wafer W. The silylating agent remaining on the wafer W can thus be completely removed by the DIW together with the IPA. Although DIW at a room temperature can be employed, use of hot DIW, for example, at 80° C. allows the remaining silylating agent on the surface of the wafer W to be removed rapidly, shortening the rinsing time.

[Etching Step]

Next, supply of the DIW from the DIW nozzle 22 is stopped. While the wafer W is kept rotating, the flow regulating valve 43 of the etching solution supply mechanism 40 is adjusted to a predetermined opening degree and the on-off valve 44 opens. An etching solution, for example, an HF-based chemical solution stored in the etching solution storage tank 41 is supplied from the etching solution nozzle 20B to the wafer W (etching step). One example of the HF-based chemical solution is an aqueous solution obtained by further diluting an aqueous solution containing 30.8 wt % $NH_4HF_2$ and 8.9 wt % HF 500 times with pure water.

This etching step is continued for a predetermined time.

During the etching step, the etching solution nozzle 20B may be moved in the radial direction of the wafer W by the nozzle moving mechanism 50 such that the nozzle 20B reciprocates (scans) once or several times between a position above the central portion of the wafer and a position above the edge portion of the wafer.

In the etching step, since the temperature of the wafer W is lower than the temperature of the etching solution, the etching solution is cooled by the wafer W as it diffuses from the central portion to the edge of the wafer W. Therefore, the central portion of the wafer W is etched by a solution at a high temperature, whereas the edge portion is etched by a solution at a low temperature, which may cause the etching conditions to vary. Further, while the central portion of the wafer W is etched by an unreacted fresh solution, the edge portion is etched by a solution containing reaction products, which may as well cause the etching conditions to vary.

When the etching conditions differ between the central portion and the edge portion of the wafer W, it is possible that the surface of the wafer W cannot be etched uniformly. Moving the etching solution nozzle 20B as described above solves these problems and enables treatment with higher in-plane uniformity.

When the etching solution nozzle 20B is to scan the wafer W, it may move (scan) in the lateral direction of the wafer W between a first nozzle position and a second nozzle position. The first nozzle position is where the etching solution nozzle 20B is positioned right above the center of the wafer W and where the etching solution drops (collides) to the center of the wafer W at the beginning of the etching step, in other words, the position at which the supply position of the etching solution is the center of the wafer W. The second nozzle position is a position where the etching solution drops to a position radially inward from the edge of the wafer by a certain distance (e.g., 10 mm).

Next, the etching solution nozzle 20B moves to a third nozzle position between the first nozzle position and the second nozzle position, where the etching solution drops to a position radially outward from the center of the wafer W by a certain distance (e.g., 15 mm). The etching solution nozzle 20B may then reciprocate between the second nozzle position and the third nozzle position.

Since the etching solution nozzle 20B returns not to the first nozzle position but to the third nozzle position, the etching amount at the central portion of the wafer W can be prevented from being excessive.

The etching solution nozzle 20B moves not to the edge of the wafer W but to the second position described above, whereby waste of the etching solution can be reduced. Incidentally, the etching solution nozzle 20B may move to the edge of the wafer W as well. Further, when scanning is to be performed, the etching solution nozzle 20B can move at a constant speed, for example, 5 to 30 mm/sec.

In the etching step performed as above by supplying the etching solution to the substrate, the silicon oxide film whose surface is protected by the silylated film will not be etched, and only the silicon nitride film will be selectively etched (refer to FIGS. 3(b) and 4(b)).

[Second Rinsing Solution Supply]

Next, supply of the etching solution from the etching solution nozzle 20B is stopped and DIW (second rinsing solution) is supplied from the DIW nozzle 22 to the center of the wafer W while the wafer W is kept rotated. The etching solution and the etching residue remaining on the surface of the wafer W are thereby removed. Although DIW at a room temperature is as well usable, use of hot DIW, for example, at 80° C. allows the etching solution and the etching residue remaining on the surface of the wafer W to be removed rapidly so as to shorten the rinsing time.

Incidentally, as described later, the silylated film functions as a protective layer for at least 3 minutes after its formation and holds sufficient durability against the etching solution through that period. However, when a great amount of silicon nitride film is to be etched, an etching step constructed in consideration to the durability of the silylated film against the etching solution may be performed.

That is, when a great amount of silicon nitride film is to be etched, a cycle comprising the silylating agent supply step, the IPA supply step, the first rinsing solution supply step, the etching solution supply step, and the second rinsing solution supply step is repeated for a plurality of times. In this method, an etching step of one cycle can be performed within a short time, for example, 3 minutes, through which the silylated film sufficiently functions. Thus, even when the desired etching amount of the silicon nitride film is large, only the silicon nitride film would be selectively etched while the silicon oxide film is effectively protected by the silylated film.

[Drying Step]

Next, supply of the DIW (second rinsing solution) from the DIW nozzle 22 is stopped, and IPA (IPA for drying) is supplied from the IPA nozzle 24 to the center of the wafer W while keeping the rotation of the wafer W.

The DIW remaining on the surface of the wafer W is then replaced by the IPA. Subsequently, supply of the IPA is stopped while the rotational speed of the wafer W is increased to remove the IPA on the surface of the wafer W. During the drying step, dry air or $N_2$ gas may be supplied to promote drying of the wafer W. Alternatively, spin drying (swing drying) may be conducted directly after the rinsing step without the process of replacing DIW with IPA.

[Removal of Silylated Film by UV Irradiation]

Next, the silylated film remaining on the surface of the wafer W is removed by UV irradiation from a UV irradiation device (not illustrated).

The UV irradiation device for performing UV irradiation on the surface of the wafer W may be incorporated in the spin chuck 10. Alternatively, the wafer W may be loaded out of the spin chuck 10 and a UV irradiation device disposed outside of the spin chuck 10 may then irradiate the surface of the wafer W with UV.

The series of solution treatments are then finalized. The treated wafer W is loaded out of the wet etching apparatus by the conveying arm not illustrated.

EXAMPLES

Examples of the present invention are to be described with reference to FIGS. 6 to 8.

Figure 6:
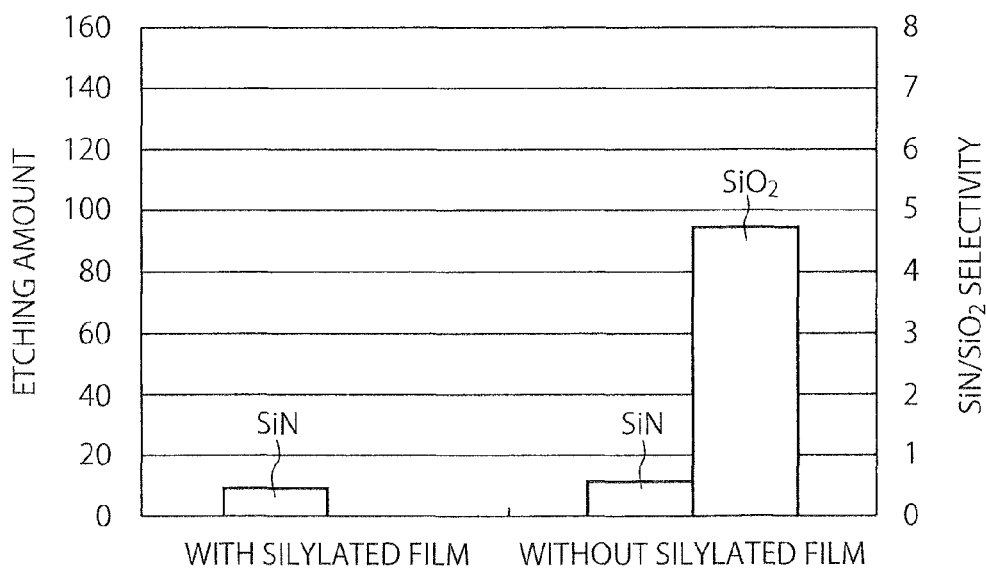
FIG. 6 is a graph showing relationships of etching amount and SiN/SiO$_2$ selectivity relative to the presence and absence of a silylated film according to an example of the present invention.

FIG. 6 shows how only the silicon nitride film is etched selectively. In FIG. 6, TMSDMA was used as the silylating agent and the agent was supplied to the wafer W for 3 min. As the etching solution, DHF (diluted hydrofluoric acid) was used and the solution was supplied to the wafer for 3 min.

In this case, while the etching amount of the silicon nitride film (SiN) etched by the etching solution was 8, the etching amount of the silicon oxide film ($SiO_2$) protected by the silylated film was substantially 0, which shows that selective etching of only the silicon nitride film was accomplished. The $SiN/SiO_2$ selectively was 100:1 or more in this case.

On the other hand, in the case where there was no silylated film, the etching amount of the silicon nitride film was 10, and the etching amount of the silicon oxide film was 100. The $SiN/SiO_2$ selectivity was 1:10, and the silicon nitride film could not be only etched selectively.

Another example was carried out in which, similarly, a TMSDMA silylating agent was supplied to a wafer for 3 min and DHF (diluted hydrofluoric acid) was used as the etching solution. The etching amount of the silicon nitride film and that of the silicon oxide film and the $SiN/SiO_2$ selectivity relative to the etching solution supply time were examined.

Figure 7:
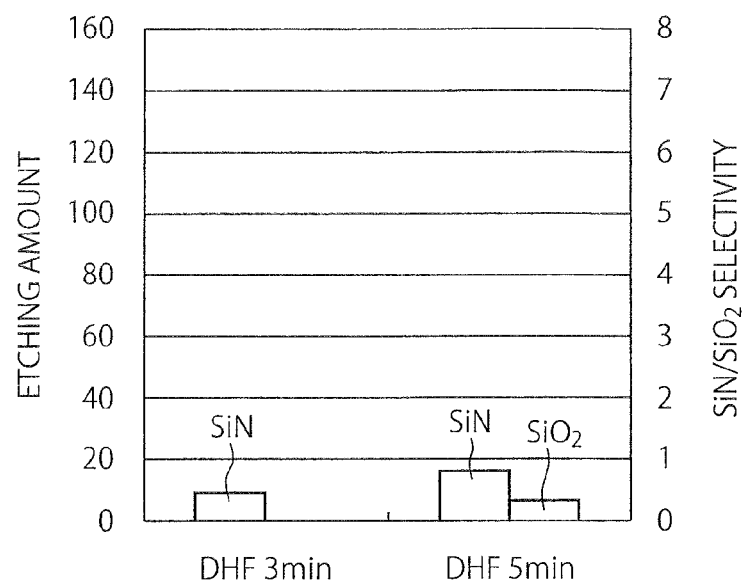
FIG. 7 is a graph showing relationships between etching amount and SiN/SiO$_2$ selectivity relative to the etching time according to another example of the present invention.

As shown in FIG. 7, when the supply time of the etching solution was 3 min, since the function of the silylated film as a protective film holds to be sufficient, the etching amount of the silicon nitride film was 8 while the etching amount of the silicon oxide film was substantially 0. As a result, the $SiN/SiO_2$ selectivity was 100:1 or more.

On the other hand, when the etching solution supply time was 5 min, since the function of the silylated film as the protective film deteriorated, the etching amount of the silicon nitride film was 15 and the etching amount of the silicon oxide film was 6. As a result, the $SiN/SiO_2$ selectivity was 2.5:1.

According to the above results, it was understood that the supply time of the etching solution is preferably within about 3 min.

Next, the hydrophobicity of the wafer surface when TMSDMA was supplied for 3 min to the wafer is described with reference to FIG. 8.

Figure 8:
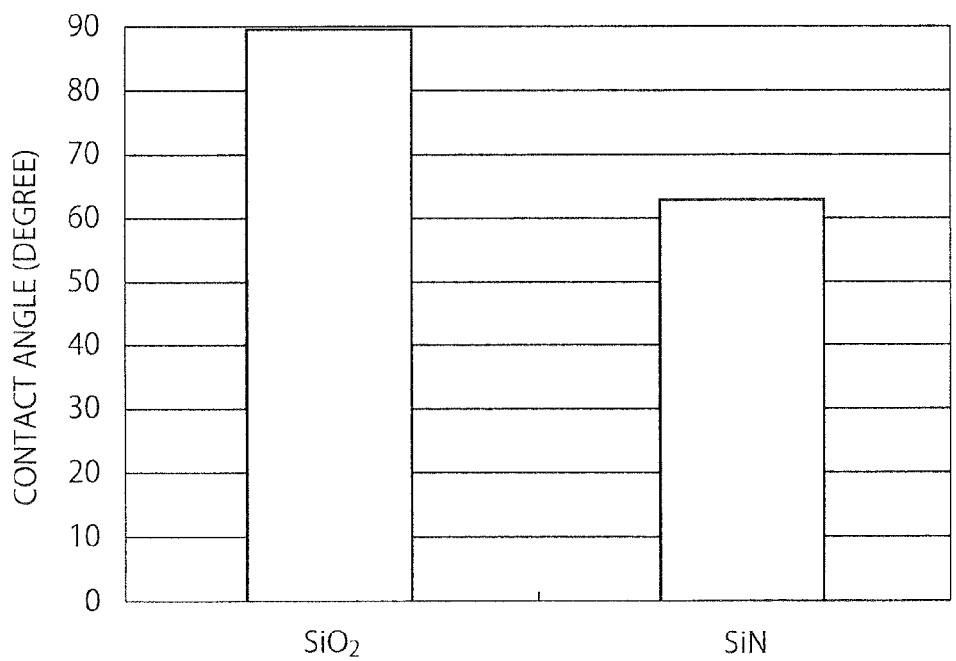
FIG. 8 is a graph showing the contact angle of a wafer surface when TMSDMA is applied according to another example of the invention.

As shown in FIG. 8, when TMSDMA is supplied to the wafer for 3 min, the contact angle of the surface of the silicon oxide film was 90°, which indicates its high hydrophobicity and that a silylated film was sufficiently formed over the surface of the silicon oxide film.

On the other hand, the contact angle of the surface of the silicon nitride film was smaller than that of the silicon oxide film, which indicates that a silylated film was not sufficiently formed over the surface of the silicon nitride film.

In the aforementioned embodiment, the substrate subjected to the treatment was a semiconductor wafer, but the treatment can be also applied to other kinds of substrates that have SiN film and $SiO_2$ film: for example, substrates for FPD (flat panel display) and substrates for MEMS (microelectro mechanical system).

What is claimed is:

1. An etching method comprising:
   preparing a substrate having a silicon nitride film and a silicon oxide film exposed on the surface thereof;
   supplying a silylating agent to the substrate having the silicon nitride film and the silicon oxide film exposed on the surface thereof so as to form a silylated film as a protective film over the surface of the silicon oxide film on the substrate;
   after supplying the silylating agent to the substrate, supplying an etching solution to the substrate where the silicon oxide film is protected by the silylated film and the silicon nitride film remains exposed on the surface thereof, so as to selectively etch the silicon nitride film, wherein in the etching step, by supplying the etching solution to the substrate, the silicon oxide film whose surface is protected by the silylated film is not etched, and the silicon nitride film is selectively etched;
   supplying a first rinsing solution to the substrate so as to remove the silylating agent, the first rinsing solution supply step being performed between the silylating agent supply step and the etching solution supply step; and
   supplying IPA to the substrate between the silylating agent supply step and the first rinsing solution supply step.

2. The etching method according to claim 1, further comprising supplying a second rinsing solution to the substrate after the etching solution supply step.

3. The etching method according to claim 1, further comprising supplying a second rinsing solution to the substrate after the etching solution supply step.

4. The etching method according to claim 3, further comprising removing the silylated film as the protective film after supplying the second rinsing solution to the substrate.

5. The etching method according to claim 4, wherein the silylated film as the protective film is removed by irradiating the substrate with UV-light.

6. The etching method according to claim 3, wherein a cycle of steps is repeatedly performed for a plurality of times, the cycle comprising:
   supplying the silylating agent to the substrate;
   supplying the IPA to the substrate;
   supplying the first rinsing solution to the substrate;
   supplying the etching solution to the substrate; and
   supplying the second rinsing solution.

7. The etching method according to claim 6, further comprising drying the substrate after supplying the second rinsing solution to the substrate.

8. The etching method according to claim 6, further comprising removing the silylated film as the protective film after supplying the second rinsing solution to the substrate.

9. The etching method according to claim 3, further comprising drying the substrate after supplying the second rinsing solution to the substrate.

10. The etching method according to claim 9, further comprising removing the silylated film as the protective film after supplying the second rinsing solution to the substrate.

11. The etching method according to claim 9, wherein IPA for drying is supplied to the substrate in the drying step.

12. The etching method according to claim 11, further comprising removing the silylated film as the protective film after supplying the second rinsing solution to the substrate.

* * * * *